United States Patent [19]

Kurtzberg et al.

[11] Patent Number: 5,953,228

[45] Date of Patent: Sep. 14, 1999

[54] METHOD EMPLOYING A BACK-PROPAGATING TECHNIQUE FOR MANUFACTURING PROCESSES

[75] Inventors: Jerome M. Kurtzberg; Menachem Levanoni, both of Yorktown Heights, N.Y.

[73] Assignee: International Business Machines Corporation, Armonk, N.Y.

[21] Appl. No.: 08/774,141

[22] Filed: Dec. 24, 1996

[51] Int. Cl.[6] ................................................ G06F 19/00
[52] U.S. Cl. ................................ 364/468.03; 364/468.16
[58] Field of Search ........................ 364/468.03, 468.15, 364/468.16, 468.12; 395/52

[56] References Cited

U.S. PATENT DOCUMENTS 5,572,437  11/1996  Rostoker et al. ........................ 364/489
5,689,622  11/1997  Higashino et al. ........................ 706/25
5,691,895  11/1997  Kurtzberg et al. ........................ 364/148

*Primary Examiner*—Paul P. Gordon
*Assistant Examiner*—Chad Rapp
*Attorney, Agent, or Firm*—Whitham, Curtis & Whitham; Stephen C. Kaufman

[57] ABSTRACT

A method capable of systematically determining the specifications of antecedent process steps subsumed in stages that unfold and move towards a specified final product requirements window. To this end, the method employs a back propagating technique that is cognizant of the specified final product requirements window.

7 Claims, 2 Drawing Sheets

METHOD EMPLOYING A BACK-PROPAGATING TECHNIQUE FOR MANUFACTURING PROCESSES

BACKGROUND OF THE INVENTION

This invention relates to a novel method for determining the specifications of antecedent process steps subsumed by a specified final product requirements window.

INTRODUCTION TO THE INVENTION

Our motivation and methodology for the present invention are informed by an illustrative situation which centers on manufacturing a planar CMOS capacitor. For this situation, a manufacturing process may include the steps of thermal oxidizing doped silicon, followed by an implanting step and a drive-in (annealing) step, and a final metallizing step. It is required that the finished product, the planar CMOS capacitor, have a capacitor threshold voltage within a specific range, and that its transconductance at a particular gate voltage be within a certain range; that is, that the finished product realize a specified final product requirements window. If possible, moreover, it is desired to select a solution which can permit the widest fluctuations in the incoming doped silicon wafers.

SUMMARY OF THE INVENTION

With respect to the aforementioned manufacturing process, we first note that it implicitly suggests to us a problem as to a determination of the ranges of the various times, temperatures, energies, and dosages, etc. (i.e., tolerances for all independent variables), for each step or stage of the manufacturing process, which aggregate steps can lead ultimately to the finished product having the specified final product requirements window.

We address this problem in the following way. First, we point out, by way of contrast and apposition, that the prior art is not cognizant of this problem, and accordingly, does not articulate a systematic method for determining an appropriate set of specifications for manufacturing processes based on product requirements. That is, to an extent the prior art may somehow intersect with the situation outlined above, it must inherently respond to it by recourse to unsatisfactory ad hoc or heuristic expedients.

We have now discovered a novel method that is capable of systematically determining the specifications of antecedent process steps subsumed in stages that unfold and move towards a specified final product requirements window. In this way, we advantageously solve our problem presented above, and fulfill an important need that is at best a default condition with respect to the prior art.

In particular, we assume that a manufacturing process may comprise a sequence of processes, each of which may be a simple or a compound process. Let the product resulting from these processes have a functionally acceptable performance window. A problem to be solved is the identification of the setpoints and tolerances of all process steps which can result in a product within its functional specifications window. This window may comprise one or more functional requirements which must be satisfied simultaneously. If multiple solutions exist, it is desired to select the one which is the least restrictive on a fabrication process. Since a complex manufacturing process may involve thousands of variables, it is also preferably required that as few as possible variables be analyzed at any one time. This requirement is a practical one, and its aim is to insure manageability and computability of complicated manufacturing processes.

The novel method, which solves this problem, comprises the steps of:

1) identifying a model product specification window for a finished product that is produced through an aggregate of antecedent individual process steps; and 2) back-propagating through the model product specification window by way of antecedent specification windows, wherein an output of a local antecedent window becomes an input for a subsequent specification window, thereby enabling a finished product which meets a specified product requirements window.

BRIEF DESCRIPTION OF THE DRAWING

The invention is illustrated in the accompanying drawing, in which.

DETAILED DESCRIPTION OF THE INVENTION

Figure 1:
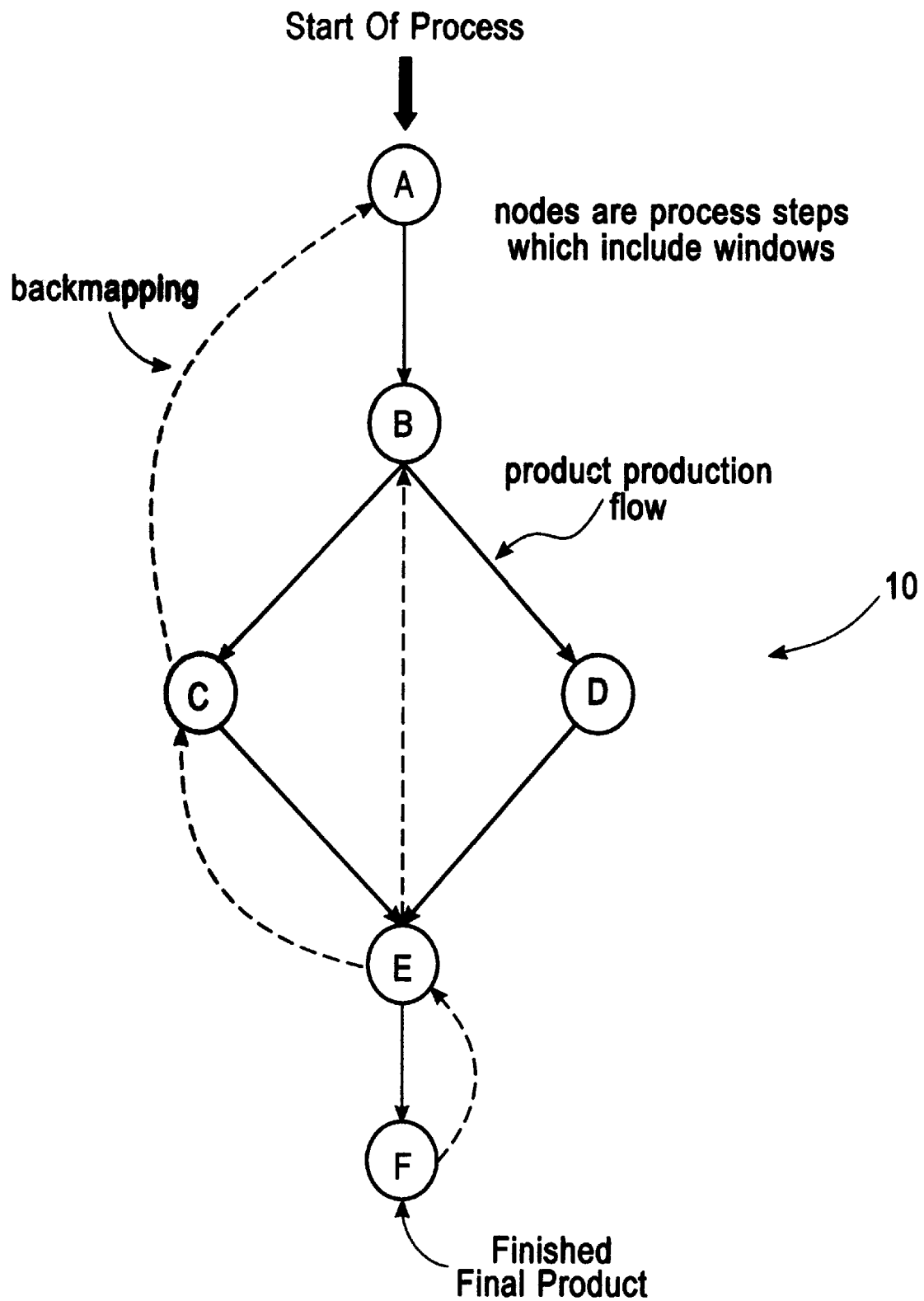
FIG. 1 shows an exemplary manufacturing process schedule generated in accordance with the method of the present invention.

The method of the present invention is summarized above, and the detailed description proceeds by unfolding in stages its various degrees of specificity and preferred embodiments. To this end, we now disclose seven steps preferably employed for realizing the method of the present invention.

Step 1

Partition the manufacturing process into a hierarchical cluster structure. This means that a process supplies to any subsequent process only those variables relevant to it. In this manner, process responses at one level become input variables at following levels. The result is a hierarchical structure in which a relative small number of variables are needed to describe any level. The final, top level, describes product in terms of input variables which are output (response) variables of lower levels.

Step 2

Obtain a conventional 2nd order Response Surface Mapping (RSM) at the product level, using the responses of the previous level as input variables. Use principal components decomposition (if needed) to insure orthogonality. This can be achieved via Design-Of-Experiments or by simply fitting a 2nd order multivariate polynomial to manufacturing data. Do this for all product responses (functional variables).

Step 3

Convert each of the product response surfaces to its corresponding hyperplane, as described in U.S. Pat. No. 5,155,677, entitled "Manufacturing Process Optimization" by J. M. Kurtzberg and M. Levanoni, issued Oct. 13, 1992 and incorporated by reference herein. Each of the resulting hyperplanes exists in its own coordinate system which depends on the eigenstructure of the original surface.

Step 4

Select, for each product response plane, the region of acceptability which corresponds to the hypertrapezoid bounded by the two product tolerance specifications and the positive coordinate axes.

Step 5

Set the response surface dependent variable y to its target value $Y_t$. The response surface becomes a hyperplane in k-1 dimensions and every point on it satisfies the target value requirement, though only positive solutions correspond to the real world. Response surface is now $<\lambda|z>=y_T-y_O=C$ Step 6

Find vector $|Z_r>$ on the hyperplane (in the positive z-space), closest to process specifications. This is the desired process setpoints vector (in z-apace).

This vector is $|z_r>=|z_s>+((C-<\lambda|z_s>)/<\lambda|\lambda>)|\lambda>$ If $|z_r>$ contains negative components, they must be set to zero and removed, and the formula recalculated with the corresponding components of $|z_s>$ and $|\lambda>$ also removed.

Step 7

Convert back from z-space coordinates to the original x-space parameters. This is the desired result. This vector $|x_T>=|x_O>+M|\sqrt{z_T}>$, represents process setpoints which yield the target value of the dependent variable (or closest to it) and, at the same time, are nearest to process design specifications. The signs of square-roots above, are chosen to match those belonging to the vector $|W_S>$.

The aforementioned mechanism was tested on a simulated fabrication of a planar CMOS capacitor. Fabrication consisted of oxidation (2 parameters—time & temperature) of an N-doped silicon wafer (1 parameter—doping concentration), and Implant step (2 parameters—dose & energy), followed by an anneal step (2 parameters —time & temperature) and metallization. The response parameter was threshold voltage of the capacitor. Implementation of the mechanism resulted in correct determination of all seven process setpoints in all tested cases, representing all possible outcomes.

Attention is now directed to FIG. 1 which shows an exemplary manufacturing "backmap" for preferred realization of the method of the present invention.

In particular, the backmap 10 comprises a set of process node steps (A through F) which include windows. Node step A is dedicated to the start of the process, which unfolds through a product production flow trajectory (solid line) to the node F of the finished final product. The dotted lines, in contrast, represent a backmapping trajectory.

With respect to backmap 10, we note that a set of inputs of a local window comprises at least one of a complete, a selectable, or a modifiable subset of the output set of its antecedent window. Further, a back-propagating step may comprise recursively traversing an antecedent specification window, wherein such traversing may be sequential or non-sequential.

Figure 2:
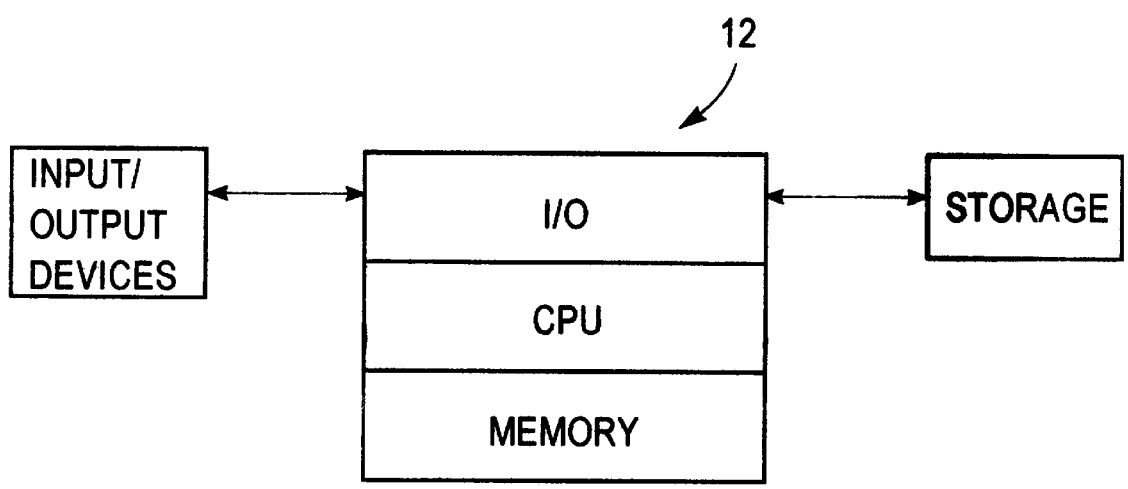
FIG. 2 shows an environment for machine realization of the method.

Attention is finally directed to FIG. 2, which shows a block diagram illustrating an exemplary computer system 12 for machine realization of the present invention. In particular, by aid of FIG. 1, the method may be readily programmed (in say, C+) in memory for operation by the FIG. 2 CPU and ultimate display.

What is claimed:

1. A method comprising the steps of:
   i) identifying a model product specification window for a finished product that is produced through an aggregate of antecedent individual process steps;

and ii) back-propagating through the model product specification window by way of antecedent specification windows, wherein an output of a local antecedent window becomes an input for a subsequent specification window, thereby enabling a finished product which meets a specified product requirements window.

2. A method according to claim 1, wherein a set of inputs of a local window comprises at least one of:
   i) a complete output set of parameters of an antecedent window;
   ii) a selectable subset of the output set of said antecedent window; and
   iii) a modifiable subset of outputs of said antecedent window.

3. A method according to claim 1, wherein the back-propagating step comprises recursively traversing the antecedent specification windows.

4. A method according to claim 3, wherein traversing the antecedent specifications windows is sequential.

5. A method according to claim 3, wherein traversing the antecedent specifications windows is nonsequential.

6. A method according to claim 1, comprising selecting a least restrictive process specification among a set of all possible solutions for generating the required product specification window.

7. A method for managing the manufacture of a product, comprising:
   partitioning a manufacturing process into a hierarchical cluster structure;
   deriving a response surface mapping at a product level based on input variables which include responses of a previous level;
   converting each of a plurality of response surfaces in said response surface mapping to a corresponding hyperplane;
   selecting, for each hyperplane, a region of acceptability corresponding to a hypertrapezoid bounded by two product tolerance specifications and positive coordinate axes;
   setting a response surface dependent variable to a target value, so that a response surface becomes a hyperplane such that every point on the hyperplane satisfies a target requirement value; and
   determining process set points which yield at least a target value closest to the dependent variable and which are nearest to process design specifications.

* * * * *